United States Patent
Bula et al.

(10) Patent No.: US 6,458,493 B2
(45) Date of Patent: *Oct. 1, 2002

(54) METHOD TO CONTROL NESTED TO ISOLATED LINE PRINTING

(75) Inventors: Orest Bula, Shelburne, VT (US); Daniel C. Cole, Jericho, VT (US); Edward W. Conrad, Jeffersonville, VT (US); William C. Leipold, Enosburg Falls, VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/325,945

(22) Filed: Jun. 4, 1999

(51) Int. Cl.⁷ .................................................. G03F 9/00
(52) U.S. Cl. ............................................................ 430/5
(58) Field of Search ............................ 430/5, 323, 324, 430/30

(56) References Cited

U.S. PATENT DOCUMENTS

| | | | |
|---|---|---|---|
| 5,242,770 A | 9/1993 | Chen et al. | 430/5 |
| 5,288,569 A | 2/1994 | Lin | 430/5 |
| 5,354,632 A * | 10/1994 | Dao et al. | 430/5 |
| 5,670,281 A | 9/1997 | Dai | 430/5 |
| 5,786,113 A | 7/1998 | Hashimoto et al. | 430/5 |
| 5,821,014 A | 10/1998 | Chen et al. | 430/5 |
| 5,827,623 A | 10/1998 | Ishida et al. | 430/5 |
| 5,914,202 A * | 6/1999 | Nguyen et al. | 430/5 |

FOREIGN PATENT DOCUMENTS

| | | |
|---|---|---|
| JP | 4-342255 | 11/1992 |
| JP | 5-27413 | 2/1993 |
| JP | 5-88356 | 4/1993 |

OTHER PUBLICATIONS

IBM Technical Disclosure Bulletin, Abolafia et al., "Dual–Density Mask for Photoresist", vol. 19, No. 12, May 1977, p.4539.

IBM Technical Disclosure Bulletin, Hance, C.R., "Low Density Mask Technique for High Reduction Photography", vol. 8, No. 12, May 1966, pp. 1798–1799.

* cited by examiner

Primary Examiner—Mark F. Huff
Assistant Examiner—Saleha R. Mohamedulla
(74) Attorney, Agent, or Firm—McGinn & Gibb, PLLC; William D. Sabo, ESq.

(57) ABSTRACT

A method and structure for a photomask that includes a substrate having a first transmittance, a first pattern to be transferred to a photosensitive layer (the first pattern having a second transmittance lower than the first transmittance) and a second pattern having a third transmittance greater than the second transmittance and less than the first transmittance. The second pattern is adjacent at least a portion of the first pattern, and the substrate and the second pattern transmit light substantially in phase.

12 Claims, 2 Drawing Sheets

METHOD TO CONTROL NESTED TO ISOLATED LINE PRINTING

BACKGROUND OF THE INVENTION

1. Field of the Invention

The present invention generally relates to microlithographic printed patterns and structures and more particularly to improvements which decrease size differences between isolated and nested structures.

2. Description of the Related Art

As the minimum feature size in semiconductor integrated circuit technology is pushed near or below the wavelength of the light used in microlithographic projection printing, diffraction effects introduce significant differences between the patterns used on microlithographic reticles and the resulting printed structures on a semiconductor wafer. Similarly, the smaller the circuit elements become, the more difficult it becomes to create the desired pattern shapes on the wafer due to factors such as localized etch variations, mask distortions, lens distortions, topography variations, and non-uniform material composition.

These physical factors introduce deviations in the dimension of printed isolated structures versus printed nested structures, with the degree of deviation being highly dependent on the degree of proximity of nearby shapes. In order to maximize circuit performance and speed, it has been advantageous to make the device structure dimensions as identical as possible (e.g., to have isolated gates and nested gates print as identically as possible). These effects become increasingly important as the physical dimensions of the circuit elements decrease. However, it is difficult to make isolated and nested structures print as identically as desired resulting in an undesirable condition known as across chip line width variation (ACLV).

ACLV is a major problem in semiconductor device fabrication. Image size variations can affect transistor speed matching and resistivity and conductance matching from one portion of the chip to another.

SUMMARY OF THE INVENTION

It is, therefore, an object of the present invention to provide a structure and method for a photomask comprising a substrate having a first transmittance, a first pattern to be transferred to a photosensitive layer (the first pattern having a second transmittance lower than the first transmittance) and a second pattern having a third transmittance greater than the second transmittance and less than the first transmittance. The second pattern is adjacent to at least a portion of the first pattern, and the substrate and the second pattern transmit light substantially in phase.

The first pattern includes nested structures and isolated structures and the second pattern is adjacent an outer edge of nested structures and the isolated structures. The nested structures are spaced more closely than the isolated structures. The second pattern may be positioned between the nested structures.

The first pattern includes a pair of outer lines and at least one inner line and the second pattern is adjacent an edge of at least one of the outer lines or an edge of the inner line.

The invention also includes a method of preparing a photomask that includes supplying a substrate having a first transmittance, forming a first pattern to be transferred to a photosensitive layer (the first pattern having a second transmittance lower than the first transmittance) and forming a second pattern having a third transmittance greater than the second transmittance and less than the first transmittance. The second pattern is adjacent at least a portion of the first pattern, and the substrate and the second pattern transmit light substantially in phase.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

As mentioned above, ACLV is a major problem in semiconductor device fabrication. One significant cause of printed pattern size variation is the diffraction component of imaging, which results in structures on a reticle being imaged differently depending upon what other reticle structures are present in the local neighborhood. A common form of this is the printed image variation that occurs between nested and isolated structures.

All the examples herein which describe the invention use a positive mask (the indicated mask shapes are made with an opaque material such as chrome) to expose a positive resist, thereby resulting in resist structures that appear close in shape and position to the opaque mask patterns. However, as would be known by one ordinary skilled in the art given this disclosure, the invention is equally applicable to all types of masking processes, such as negative photoresist processes.

Further, while the structures are classified herein as "nested" (e.g., being adjacent other structures) and "isolated" (e.g., standing alone), these terms are not intended to limit the application of the invention. Since items in printed patterns are always somewhat "adjacent" other items, the same structure could be nested with respect to some structure and at the same time be isolated with respect to other structures. Thus, the relative nature of the terms "nested" and "isolated" does not limit the application of the invention. To the contrary, such terms are merely used to illustrate the operation of the invention with respect to some specific examples (such as those shown in FIGS. 1–4).

The invention places "gray" regions 10, 11 in specific locations of the mask to correct the nested and isolated printing mismatch. The invention produces significant improvement in the printability of nested to isolated patterns by adding gray regions 10, 11. "Gray," as used herein, has a magnitude of transmittance between 0% and 100% and preferably a transmittance of about 85%.

In the examples used herein, the phase of these gray regions 10, 11 is equal to the phase of the clear regions of the mask. However, the invention is equally applicable to phase shift masks. As would be known by one ordinarily skilled in the art given this disclosure, altering the phase of the "gray" regions 10, 11 can also be used as a "knob" to improve performance. In the following examples the gray regions are used with phase zero (as compared with the clear regions) and with a transmittance of about 85%.

Further, while the following examples are discussed with respect to a size of 0.25 microns, as would be apparent to those ordinarily skilled in the art, the invention is equally applicable to any dimensions of interest, for example, 0.175 microns. In FIGS. 1 through 4, the left side of each figure represents the mask design while the right side represents the printed structures.

Figure 3:
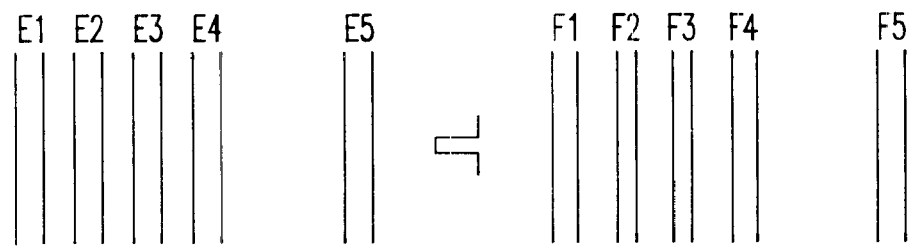
FIG. 3 shows mask nested and isolated lines on the left with the corresponding wafer level aerial images on the right where nested lines print small relative to isolated lines.

The nested lines, as shown in the left side of FIG. 3 (E1 through E4), usually print smaller (F1 through F4) than the isolated line (E5 versus the printed line of F5). Thus, ACLV is apparent as F1 through F4 are smaller in width than F5.

Figure 1:
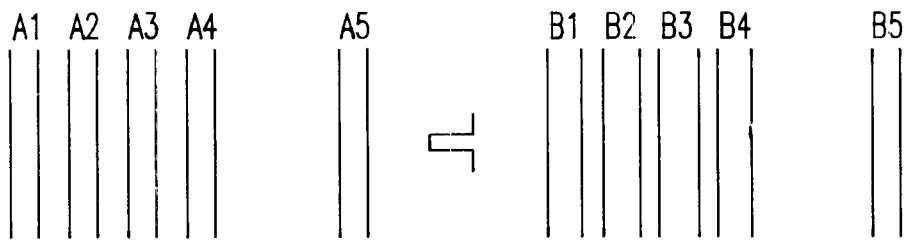
FIG. 1 shows mask nested and isolated lines on the left with the corresponding wafer level aerial images on the right.

Although this behavior is what is typically observed for line/space dimensions of current interest (i.e., nested lines printing smaller than isolated lines for a positive mask with positive resist), this behavior is not always seen if, for example, the period of the line/space pattern is sufficiently large. Indeed, FIG. 1 represents the opposite case, where nested mask images A1 through A4 print larger (B1 through B4) than isolated mask image A5 prints (B5).

This disclosure illustrates the invention using gray regions in two cases. However, as would be known by one ordinarily skilled in the art, the invention is equally applicable to other similar printing systems. The first case, as represented by FIGS. 1 and 2, involves the situation where the nested lines print larger than the isolated line, while FIGS. 3 and 4 involve the situation where the nested lines print smaller than the isolated line, which is the problem observed more often in current technologies.

Regarding case 1, where the nested images print larger than the isolated image, there are also size differences between the printed nested images themselves. More specifically, the inner mask images (A2 and A3) print larger (B2 and B3) than the outer mask images (A1 and A4) will print (B1 and B4). The reason for this result is that the inner lines are more "nested" than the outer lines, so the outer lines will mimic the behavior of the isolated line (A5 and B5) more than the inner lines. The same result occurs in case 2 (FIGS. 3 and 4), where the nested lines print smaller than the isolated lines. More specifically in FIGS. 3 and 4, the outer lines (F1 and F4) are closer in character to an isolated line (F5), therefore, they print closer in dimensions (although still smaller than a fully isolated line) than do the inner lines (F2 and F3).

Figure 2:
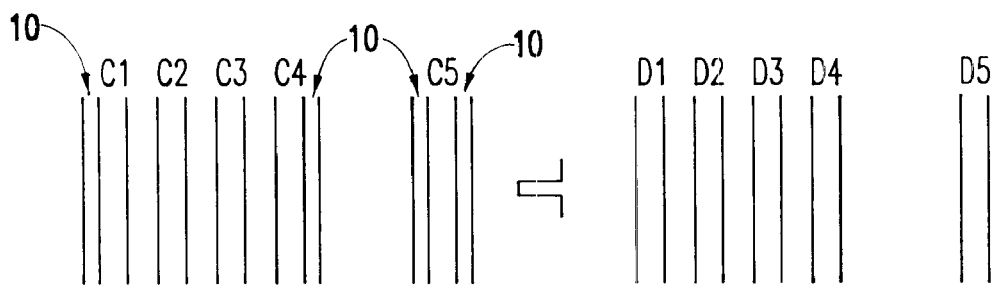
FIG. 2 shows corrected mask nested and isolated lines on the left with the corresponding wafer level aerial images on the right where nested lines print the same as isolated lines.

For case 1, placing gray regions 10 outside the isolated mask line C5 and outside the outer nested mask lines C1 and C4, as shown in FIG. 2, results in printed structures shown by D1 through D4, which have a closer dimension to D5. Thus, for example, in FIG. 1, the nested mask pattern structures of A1 through A4 and isolated mask pattern structure A5 may all be 0.25 microns wide. The exposure is set to print images D2 and D3 0.25 microns wide. If the remaining images D1, D4 and D5 are not also 0.25 microns wide, then mask compensation is applied to all images. Ignoring effects which occur at the line ends, resist nested images B1 and B4 print 0.275 microns wide and resist nested images B2 and B3 print 0.30 microns wide when the exposure has been selected to print isolated resist image B5 0.25 microns wide. This ACLV is resolved with the invention as shown in FIG. 2.

In FIG. 2 nested mask pattern structures C1 through C4 and isolated mask image C5 are all (for example) 0.25 micron wide because of the gray areas 10. Ignoring effects which occur at the line ends, all resist images B1 through B5 can be made to print 0.25 microns wide by applying gray zones 10 to the outer edges of outer nested mask images C1 and C4. The exposure is set to print images D2 and D3 0.25 microns wide.

If the remaining images D1, D4 and D5 are not also 0.25 microns wide, then mask compensation is applied to all images. Mask compensation is the adjustment of the size of all shapes so as to achieve the desired nominal line width on the wafer once differences in printed line widths due to proximity have been corrected.

Continuing with a similar example, in FIG. 3 nested mask images E1 through E4 and isolated mask image E5 are all (for example) 0.25 micron wide. Ignoring effects which occur at the line ends, resist nested images F1 and F4 print (for example) 0.225 microns wide and resist nested images F2 and F3 print 0.20 microns wide when the exposure has been selected to print isolated resist image F5 0.25 microns wide. This difference is corrected with the invention as shown in FIG. 4.

Figure 4:
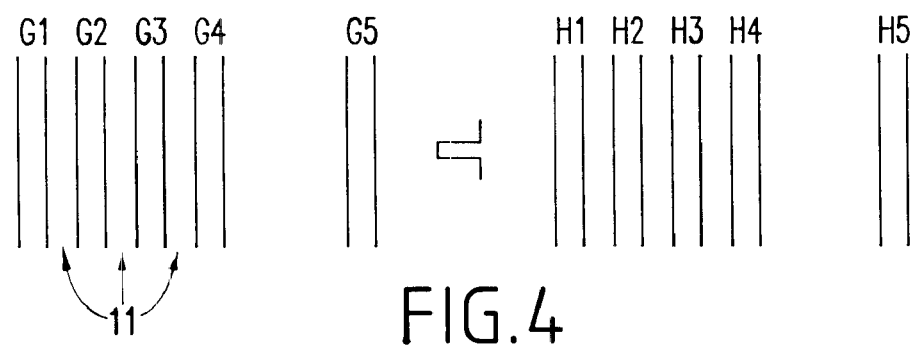
FIG. 4 shows corrected mask nested and isolated lines on the left with the corresponding wafer level aerial images on the right where nested lines print the same as isolated lines.

More specifically, in FIG. 4, nested mask images G1 through G4 and isolated mask image G5 are all (for example) 0.25 micron wide. Ignoring effects which occur at the line ends, all resist images H1 through H5 can be made to print 0.25 microns wide by applying gray zones 11 between mask images G1 and G2, G2 and G3, and G3 and G4. The exposure is set to print the isolated image H5 0.25 micron wide.

The reasons why adding the gray regions 10, 11 helps make the nested structures print more like isolated ones can perhaps best be understood by examining the spaces, rather than the lines. In FIG. 3, the nested lines F1–F4 print too narrow as compared with the isolated line F5, or, the nested spaces print too wide to enable the nested lines F1–F4 to print as the isolated line F5. To make the spaces print narrower, thereby making the lines F1–F4 print wider, the invention inserts the gray regions 11, thereby making the resist regions that are eventually dissolved away smaller in width, thereby achieving the desired result. The gray regions 11 affect the "inner" spaces more than the outer ones. This compensates G2 and G3 more than G1 and G4 which reduces the width among differences the nested F1–F4 lines, as discussed above.

For the other case of FIG. 1, the nested lines A1–A4 print as wider lines (B1–B4) than the isolated line B5 because the spaces print too narrow. To make them print wider, more light needs to be delivered to the nested line/space structure, as compare with the light delivered to the isolated line structure. This can be accomplished by adding the gray regions 10 around the isolated line, as indicated by C5 in FIG. 2, which reduces the light delivered to the isolated line. To make the isolated line D5 print the desired width, the exposure time needs to be increased, which allows more light to enter the region of the nested line structures D1–D4. This increases the widths of the spaces between the lines and decreases the original width of the lines (D1 through D4 are smaller in width than B1 through B4). Since, as discussed above, the outer lines B1 and B4 are not as wide as B2 and B3, the outer lines B1 and B4 do not need to be adjusted as much, and in order to make their effective proximity correction more like the isolated line, then gray regions can be placed only outside mask images C1 and C4 to make the printed structure (D1 and D4) close in width to the isolated and to the inner nested line widths.

Figure 5:
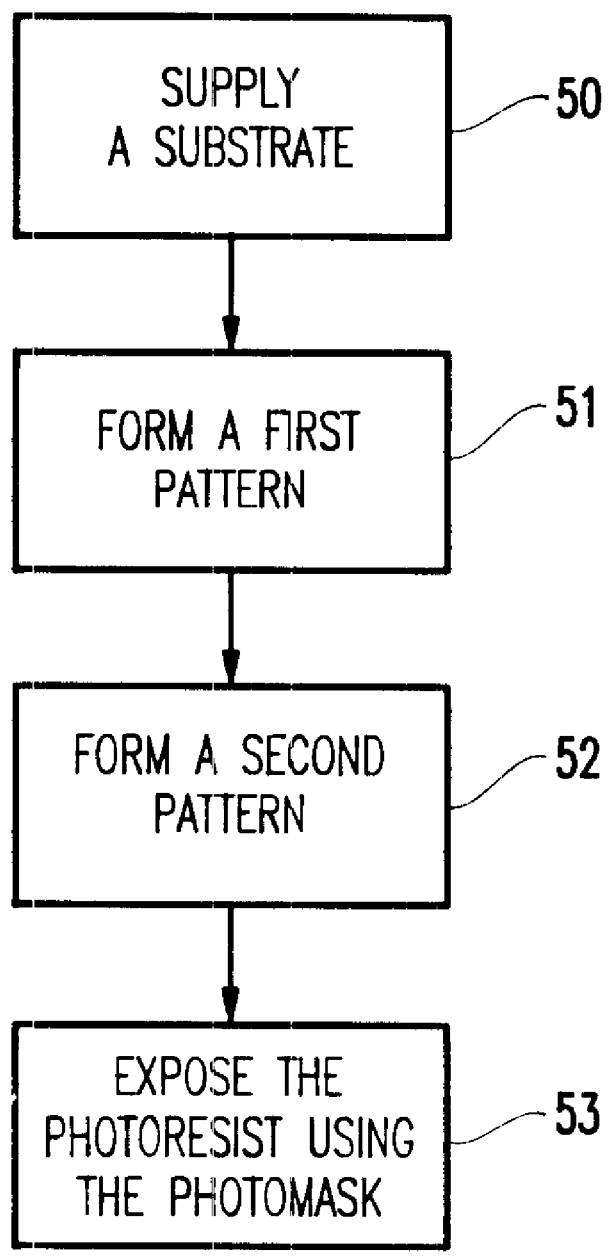
FIG. 5 is a flow diagram of an embodiment of the invention.

FIG. 5 illustrates a first embodiment of the invention in flowchart form. The process shown in FIG. 1 first supplies a substrate as shown in item 50. In item 51 a first pattern C1–C5, G1–G5 is formed and then a second pattern 10, 11 is formed as shown in item 52. Finally, the photoresist is exposed using the photomask as shown in item 53.

As discussed above, the invention corrects the difference between nested and isolated printed structures using gray areas in the mask. Another way to reduce these differences is to simply bias the line dimensions differently. However, depending on the dimensions involved, biasing the line dimensions differently is not always helpful, because it can hurt the process window (e.g., depth of focus). To the contrary, the invention improves the process window and allows additional flexibility.

Bias changes used to be limited to an integer multiple of the mask writing grid size. However, the recent use of halftone biasing and sub-resolution jogs in place of line edges, enables sub-grid size corrections to line widths. This method significantly increases the volume of the data to be written on the mask. The inventive gray areas can be used in combination with such bias change to fine tune the consistency of the printed images.

The examples shown above all involved 4 "nested" lines. However, as would be apparent to one ordinarily skilled in the art, the invention is not limited to four straight structures but is equally applicable to any number of straight or differently shaped structures. This method can be used to control line width alone or in conjunction with other techniques.

The increase in data volume is small and the size of the gray areas is large enough to be printed by older mask writing tools. Thus, the problems associated with printing and inspecting sub-resolution features are not encountered with this method. Further, different areas of a chip can be adjusted independently by varying the sizes of the gray areas. Also, the use of multiple reduced transmittance films on the mask enables additional line width tailoring capability.

While the invention has been described in terms of preferred embodiments, those skilled in the art will recognize that the invention can be practiced with modification within the spirit and scope of the appended claims.

What is claimed is:

1. A photomask comprising:

substrate having a first transmittance;

a first pattern to be transferred to a photosensitive layer, wherein said first pattern is opaque, and said first pattern has second transmittance, lower than said first transmittance; and second pattern having a third transmittance greater than said second transmittance and less than said first transmittance, said second pattern being applied to an outer edge of said first pattern, wherein said first pattern includes nested structures and isolated structures and said second pattern is laterally adjacent only outer edges of said nested structures and said isolated structures, wherein said nested structures are spaced more closely than said isolated structures, and wherein said substrate and said second pattern transmit light in-phase.

2. The photomask in claim 1, wherein said first pattern includes a pair of outer lines and at least one inner line and said second pattern is adjacent an edge of at least one of said outer lines.

3. The photomask in claim 1, wherein said first pattern includes a pair of outer lines and at least one inner line and said second pattern is adjacent an edge of said inner line.

4. A method of preparing a photomask comprising:

supplying a substrate having a first transmittance;

forming a first pattern to be transferred to a photosensitive layer, wherein said first pattern is opaque, and said first pattern has a second transmittance, lower than said first transmittance; and forming a second pattern having a third transmittance greater than said second transmittance and less than said first transmittance, said second pattern being applied to an outer edge of said first pattern, wherein said first pattern includes nested structures and isolated structures and said second pattern is laterally adjacent only outer edges of said nested structures and said isolated structures, wherein said nested structures are spaced more closely than said isolated structures, and wherein said substrate and said second pattern transmit light-in-phase.

5. The method in claim 4, wherein said first pattern includes a pair of outer lines and at least one inner line and said second pattern is adjacent an edge of at least one of said outer lines.

6. The method in claim 4, wherein said first pattern includes a pair of outer lines and at least one inner line and second pattern is adjacent an edge of said inner line.

7. A photomask comprising:

substrate having a first transmittance;

a first pattern to be transferred to a photosensitive layer, wherein said first patter is opaque, and said pattern has a second transmittance, lower than said first transmittance; and a second pattern having a third transmittance greater than said second transmittance and less than said first transmittance, said second pattern being applied to an outer edge of said first pattern, wherein said first pattern includes a nested structures and isolated structures and said second pattern is positioned only laterally between said nested structures, wherein said nested structures are spaced more closely than said isolated structures, and wherein said substrate and said second pattern transmit light in-phase.

8. The photomask in claim 7, wherein said first pattern includes a pair of outer lines and at least one inner line and said second pattern is adjacent an edge of at least one of said outer lines.

9. The photomask in claim 7, wherein said first pattern includes a pair of outer lines and at least one inner line and said second pattern is adjacent an edge of said inner line.

10. A method of preparing a photomask comprising:

supplying a substrate having a first transmittance;

forming a first pattern to be transferred to a photosensitive layer, wherein said pattern is opaque, and said first pattern has a second transmittance, lower than said first transmittance; and forming a second pattern having a third transmittance greater than said second transmittance and less than said first transmittance, said second pattern being applied to an outer edge of said first pattern, wherein said first pattern includes nested substrate and isolated structures and said second pattern is positioned only laterally between said nested structures, wherein said nested structures are spaced more closely than said isolated structures, and wherein said substrate and said second pattern transmit light in-phase, 11. The method in claim 10, wherein said first pattern includes a pair of outer lines and at least one inner line and said second pattern is adjacent an edge of at least one of said outer lines.

12. The method in claim 10, wherein said first pattern includes a pair of outer lines and at least one inner line and said second pattern is adjacent an edge of said inner line.

* * * * *